United States Patent
Minamio et al.

(10) Patent No.: US 7,745,834 B2
(45) Date of Patent: Jun. 29, 2010

(54) SEMICONDUCTOR IMAGE SENSOR AND METHOD FOR FABRICATING THE SAME

(75) Inventors: Masanori Minamio, Osaka (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 586 days.

(21) Appl. No.: 11/471,659

(22) Filed: Jun. 21, 2006

(65) Prior Publication Data
US 2007/0029582 A1    Feb. 8, 2007

(30) Foreign Application Priority Data
Aug. 3, 2005    (JP) .................. 2005-225621

(51) Int. Cl.
*H01L 27/148* (2006.01)
(52) U.S. Cl. .............. 257/81; 257/98; 257/234; 257/E29.325; 348/294
(58) Field of Classification Search ........ 257/434, 257/432, 433, 437, 435, 444, 234, 228, 232, 257/E29.325, E29.067, E29.237, 431, 81, 257/84, 98, 99, 100; 348/294, 297, 308
See application file for complete search history.

(56) References Cited

U.S. PATENT DOCUMENTS 6,621,616 B1 *   9/2003   Bauer et al. .................. 359/273
7,221,051 B2 *   5/2007   Ono et al. .................... 257/704
2004/0104478 A1   6/2004   Noguchi
2004/0130640 A1   7/2004   Fujimori

FOREIGN PATENT DOCUMENTS

| JP | 04-212459 | 8/1992 |
|---|---|---|
| JP | 05-102449 | 4/1993 |
| JP | 2001-308229 | 11/2001 |
| JP | 2002-026301 | 1/2002 |
| JP | 2003-031782 A | 1/2003 |
| JP | 2004-111792 | 4/2004 |
| JP | 2004-179495 | 6/2004 |
| JP | 2004-207461 | 7/2004 |
| JP | 2006-147835 | 6/2006 |

OTHER PUBLICATIONS

Chinese Office Action, with English translation, issued in Chinese Patent Application No. 200610103157.2, mailed Apr. 24, 2009.
Japanese Office Action, with English translation, issued in Japanese Patent Application No. 2005-225621, mailed Nov. 24, 2009.

* cited by examiner

*Primary Examiner*—Hoa B Trinh
(74) *Attorney, Agent, or Firm*—McDermott Will & Emery LLP

(57) ABSTRACT

A semiconductor image sensor includes: a semiconductor imaging element including an imaging area, a peripheral circuit area, and an electrode area; cylindrical electrodes provided on electrode terminals so as to be electrically connected with an external device; and a transparent resin layer provided on the upper surface of the semiconductor imaging element. The upper surface of each cylindrical electrode and the upper surface of the transparent resin layer are substantially of the same height.

15 Claims, 8 Drawing Sheets

SEMICONDUCTOR IMAGE SENSOR AND METHOD FOR FABRICATING THE SAME

BACKGROUND OF THE INVENTION

1. Field of the Invention

The present invention relates to semiconductor image sensors and methods for fabricating the same.

2. Description of the Related Art

In recent years, as electronic devices have become smaller, thinner and lighter, there has been a growing demand for high-density packaging of semiconductor components. Because of this demand together with the high degree of integration achieved by the development of fine processing technology, semiconductor imaging elements, in particular, are being strongly required to shift from a conventional package type, in which a semiconductor imaging element is incorporated into a package, to another type, in which a semiconductor imaging element as a bare chip is directly mounted onto an electronic device.

For example, Japanese Laid-Open Publication No. 2004-111792 discloses a semiconductor package, which includes no through-hole conductors so as to be reduced in thickness, and a method for fabricating the package. This conventional semiconductor image sensor has a device area on one surface thereof and includes a semiconductor substrate having therein connection pads which are connected with the device area, a supporting substrate provided to one surface of the semiconductor substrate, external electrodes (solder balls) provided to the other surface of the semiconductor substrate, and connection means partially extended beyond the periphery of the semiconductor substrate to establish electrical connection between the connection pads and the external electrodes.

In the above-described first conventional example, an imaging area is provided on the one surface of the semiconductor image sensor, while the supporting substrate is provided to the one surface of the semiconductor substrate having the connection pads that are connected with the imaging area, and cylindrical electrodes are formed to the other surface of the semiconductor substrate. This structure allows the package to become thinner. In addition, since the connection means for electrically connecting the connection pads and the cylindrical electrodes are partially extended beyond the periphery of the semiconductor substrate, the structure with no through-hole conductors is realized.

Also, Japanese Laid-Open Publication No. 05-102449 discloses a solid-state image sensor, in which despite its transparent-resin-encapsulated structure, occurrence of flares, smears and the like is suppressed, and a method for fabricating the sensor. According to this second conventional example, the solid-state image sensor, in which wiring is provided on a lead frame, is entirely encapsulated by a transparent resin. Furthermore, at least the part of the outer surfaces of the transparent resin other than the surface thereof corresponding to an effective pixel area is covered with a black resin. The method for fabricating this solid-state image sensor includes: the step of encapsulating by the transparent resin the entire solid-state image sensor having the wiring provided on the lead frame; the step of covering the entire transparent resin by the black resin; and the step of removing part of the black resin existing above the effective pixel area in the solid-state image sensor.

SUMMARY OF THE INVENTION

However, in the above-described first conventional example, the electrical connection between the connection pads provided in the semiconductor substrate and the solder balls is made by way of the outer sides of the semiconductor substrate. This increases the plan dimension of the semiconductor image sensor, thereby making it difficult to reduce the size thereof.

In the second conventional example, it is possible to remove optical noise, such as flares and smears, caused by reflected light entering the imaging area. Nevertheless, since the second conventional example uses gold wires to establish the connection, incoming light from the upper surface of the transparent resin may strike the upright portions of the gold wires and then may be reflected from the upright portions. And the reflected light may enter the imaging area. If the reflected light enters the imaging area, flares and smears may be caused in the image.

It is therefore an object of the present invention to provide a smaller and thinner semiconductor image sensor capable of removing optical noise, such as flares and smears, and a method for fabricating the sensor.

In order to achieve the above object, a first inventive semiconductor image sensor, which is connected with an external device when the sensor is used, includes: a semiconductor imaging element including an imaging area for detecting light, a peripheral circuit area, and an electrode area in which electrode terminals are formed; a transparent resin layer formed on a circuit-formation surface of the semiconductor imaging element; and cylindrical electrodes formed on the electrode terminals, having an upper surface existing in the same plane as an upper surface of the transparent resin layer, and provided for connection with the external device.

With this structure, there is no need for forming a rerouting layer and routing connection wires to establish the connection with the external circuit. This structure also eliminates the need to form a package for protecting the imaging area, thereby realizing a semiconductor image sensor that is significantly thinner than conventional semiconductor image sensors. In addition, the outside dimension of the semiconductor image sensor can be made equal to that of the semiconductor imaging element, whereby the planar area of the semiconductor image sensor can be reduced as compared with the conventional semiconductor image sensors.

If the first inventive semiconductor image sensor further includes antireflection films provided on side faces of the cylindrical electrodes, it is possible to prevent light reflected from the cylindrical electrodes from entering the imaging area, whereby adverse effects of optical noise such as flares and smears are reduced considerably.

The transparent resin layer may be made of an epoxy resin, an acrylic resin, or a polyimide resin, for example, or may be made of a mixture of these resins.

A second inventive semiconductor image sensor includes: a semiconductor imaging element including an imaging area for detecting light, a peripheral circuit area, and an electrode area in which electrode terminals are formed; and a transparent sheet bonded at least to the imaging area with a transparent adhesive member interposed therebetween.

With this structure, the thickness of the semiconductor image sensor can be reduced as compared with conventional resin-encapsulated semiconductor image sensors. In addition, the planar area of the semiconductor image sensor can be made almost as small as that of the semiconductor imaging element.

The adhesive member herein may be a transparent resin adhesive, a transparent adhesive sheet, or the like.

If the second inventive semiconductor image sensor further includes a first antireflection film provided on side faces of the transparent sheet, it is possible to prevent light reflected from a connecting member, such as gold wires, used for the connection with the external device from entering the imaging area, whereby occurrence of flares and smears can be suppressed.

A first inventive method for fabricating a semiconductor image sensor includes the steps of: (a) forming cylindrical electrodes on a semiconductor imaging element array, in which a plurality of semiconductor imaging elements each including electrode terminals are formed, the cylindrical electrodes being formed on the electrode terminals; (b) forming a transparent resin layer having a thickness that allows at least the cylindrical electrodes to be buried in the transparent resin layer; (c) polishing the transparent resin layer so that an upper surface of each cylindrical electrode and an upper surface of the transparent resin layer are of the same height; and (d) dicing the semiconductor imaging element array into individual pieces, in each of which one of the semiconductor imaging elements is formed.

By this method, it is possible to easily fabricate semiconductor image sensors of small thickness and small size. If the upper surface of each cylindrical electrode and the upper surface of the transparent resin layer are processed into a mirror surface in the step (c), the optical characteristics are improved further.

If the first inventive method further includes the step (e) of forming an antireflection film on an exposed surface of each cylindrical electrode between the step (a) and the step (b), and in the step (c) the transparent resin layer is polished until the upper surface of each cylindrical electrode is exposed, reflected light from the cylindrical electrodes is suppressed, whereby semiconductor image sensors in which occurrence of flares and smears is suppressed can be fabricated.

A second inventive method for fabricating a semiconductor image sensor includes the steps of: (a) bonding a transparent sheet array having grooves formed therein to a circuit-formation surface of a semiconductor imaging element array, in which a plurality of semiconductor imaging elements each including electrode terminals are formed, in such a manner that the electrode terminals are located inside the grooves, the grooves being formed in portions in the transparent sheet array that correspond to regions in which the electrode terminals are formed; (b) polishing the transparent sheet array until the bottom of each groove is reached, thereby forming a transparent sheet on each of the semiconductor imaging elements; and (c) dicing the semiconductor imaging element array into individual pieces, in each of which one of the semiconductor imaging elements is formed.

By this method, all of the transparent sheets for protecting the imaging areas can be formed over the wafer at the same time, whereby semiconductor image sensors of small thickness and small size can be fabricated at low cost.

DETAILED DESCRIPTION OF THE INVENTION

Figure 1:
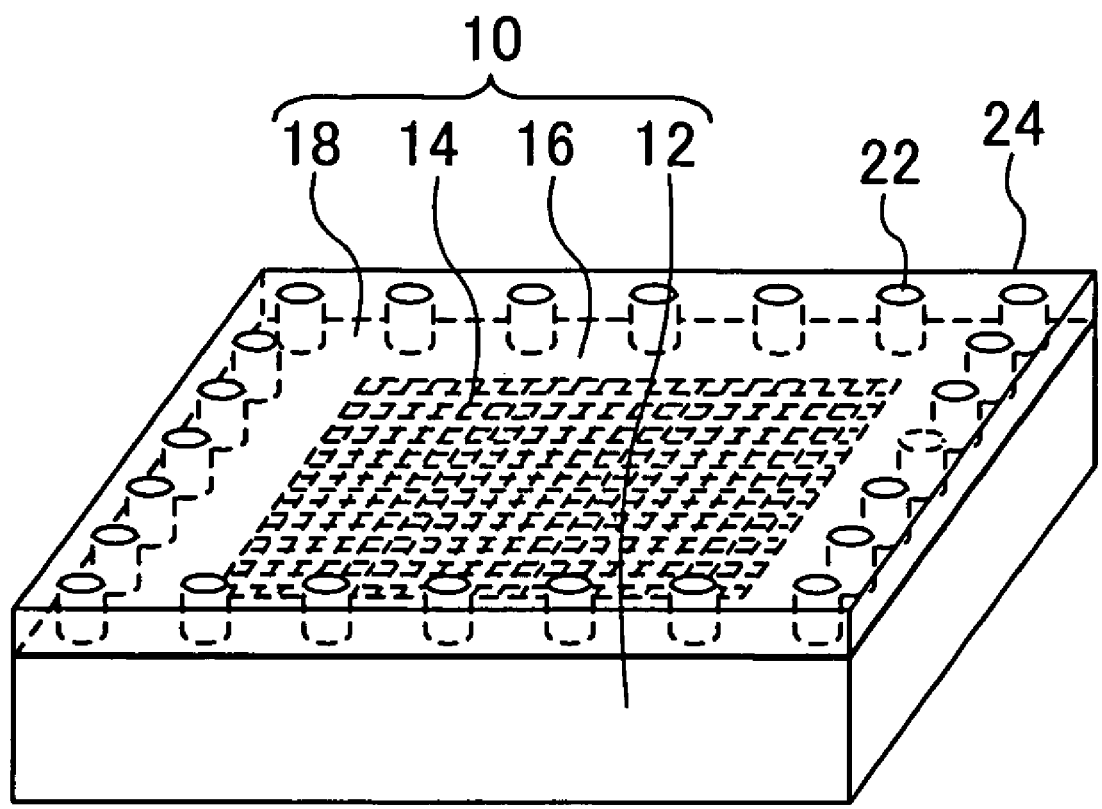
FIG. 1 is an oblique view schematically illustrating the entire structure of a semiconductor image sensor according to a first embodiment of the present invention.

Hereinafter, preferred embodiments of the present invention will be described in detail with reference to the accompanying drawings. In the drawings, the thickness, length and the like of each of members are shown in schematic form and the actual shape thereof is different from that shown in the drawings. And the number of electrode terminals and the like in semiconductor imaging elements shown in the drawings are also different from the actual number. Moreover, components common to the individual embodiments are designated by the same reference numerals and descriptions thereof will be thus partially omitted herein.

First Embodiment

Figure 2A:
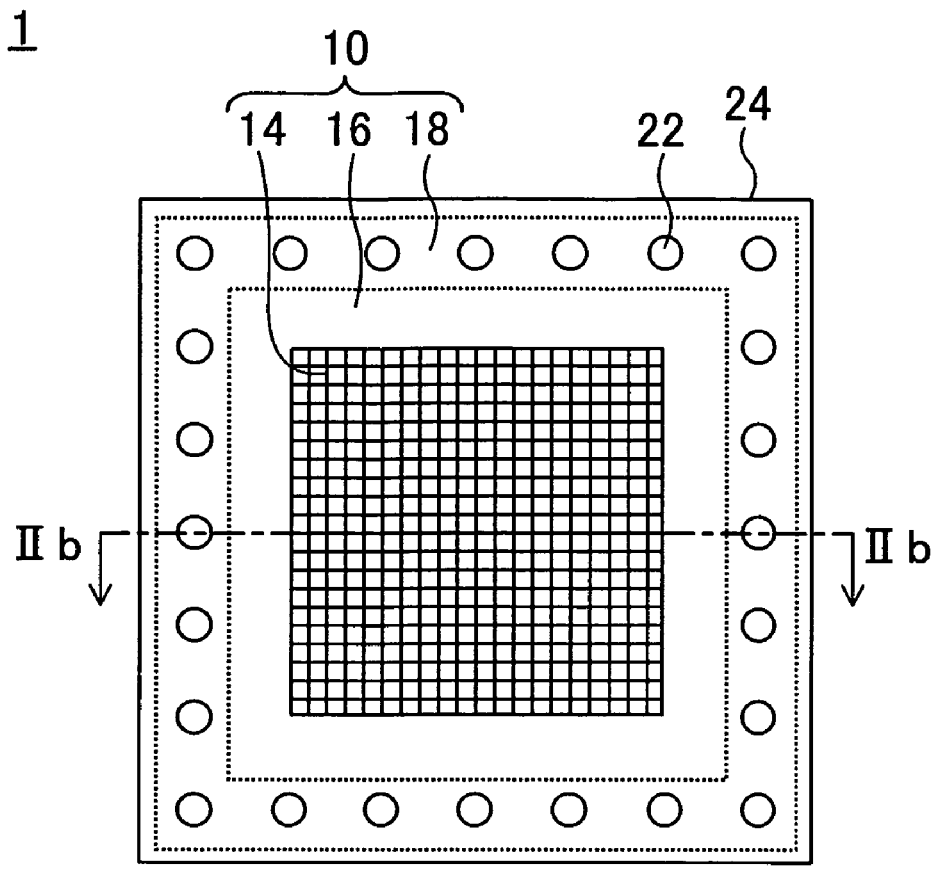
FIGS. 2A and 2B are a plan view and a cross-sectional view taken along the line IIb-IIb, respectively, each illustrating the semiconductor image sensor of the first embodiment.
Figure 2B:
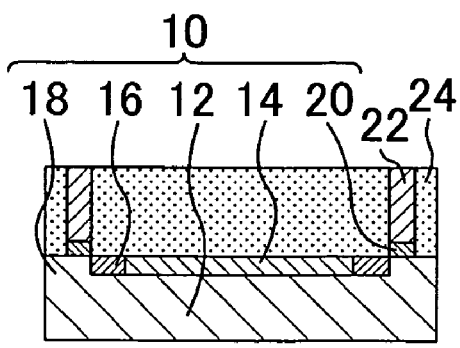

FIG. 1 is an oblique view schematically illustrating the entire structure of a semiconductor image sensor according to a first embodiment of the present invention. FIGS. 2A and 2B are a plan view and a cross-sectional view taken along the line IIb-IIb, respectively, each illustrating the semiconductor image sensor of this embodiment.

As shown in FIGS. 1 and 2, the semiconductor image sensor 1 of this embodiment includes a semiconductor imaging element 10, cylindrical electrodes 22, and a transparent resin layer 24 formed on the entire upper surface of the semiconductor imaging element 10.

The semiconductor imaging element 10 includes a semiconductor substrate 12, an imaging area 14 formed on the semiconductor substrate 12, a peripheral circuit area 16 surrounding the imaging area 14, and an electrode area 18 including electrode terminals 20 for establishing connection with an external circuit or circuits. The cylindrical electrodes 22 are formed on the electrode terminals 20. The peripheral circuit area 16 is located between the imaging area 14 and the electrode area 18 in which the electrode terminals 20 are provided. In the peripheral circuit area 16, a circuit (not shown) is formed. The circuits provided in the peripheral circuit area 16 and in the imaging area 14 are formed on the semiconductor substrate 12 made of silicon or the like by using semiconductor processes.

The transparent resin layer 24 is made of thermosetting resin or thermoplastic resin and the upper surface thereof is planarized so as to prevent refraction of incident light. The electrode terminals 20 are aligned along each side of the periphery of the semiconductor image sensor 1. The upper surfaces of the respective cylindrical electrodes 22 formed on the electrode terminals 20 are exposed to the outside. The size of the transparent resin layer 24 in plan configuration is almost the same as that of the semiconductor imaging element 10, and the thickness of the transparent resin layer 24 is the same as that of the cylindrical electrodes 22.

Although not shown, if a glass substrate is provided as the uppermost layer over the imaging area 14, the glass substrate avoids adhesion of dust coming from the outside and thereby improves resistance to scratches. In that case, the transparent resin layer 24 is preferably made of a material whose refractive index is lower than that of the glass substrate. Furthermore, an antireflection film may be provided on the side faces of the glass substrate.

Hereinafter, each of the members will be discussed in detail mainly with reference to FIG. 2.

First, the imaging area 14 is located in the center of the semiconductor imaging element 10 and includes a CCD circuit or a CMOS circuit, a color filter, and an array of pixels, in which pixels having a microlens are arranged two dimensionally. The size of each pixel is from about a 2-µm square to about a 6-µm square, for example. Each pixel receives light incident from the outside and outputs an electric signal.

The peripheral circuit area 16 located in the region surrounding the imaging area 14 in the semiconductor imaging element 10 includes a circuit for processing the electric signals output from the array of pixels and transmitting the resultant signals to an external circuit.

In the outermost region in the semiconductor imaging element 10, the electrode area 18 including the plurality of electrode terminals 20 is formed.

The upper surface of the transparent resin layer 24 provided on the entire upper surface of the semiconductor imaging element 10 including the imaging area 14 is planarized to such a degree that refraction of light incident on the upper surface of the transparent resin layer 24 is prevented. However, at the surface of part of the transparent resin layer 24 located on the electrode area 18, the upper surface of each cylindrical electrode 22 formed on the electrode terminal 20 is exposed. The upper surface of each cylindrical electrode 22 and the upper surface of the transparent resin layer 24 are of the same height and formed in the same plane. The cylindrical electrodes 22 are connected at their upper surfaces with the external circuit.

The transparent resin layer 24 is preferably made of epoxy resin, acrylic resin, or polyimide resin, which contains very few impurities and bubbles.

Also, the method for forming the cylindrical electrodes 22 may be selected from various kinds of methods, including electrolytic plating, stud bump bonding, ultrasonic heating ball bonding, and a method in which cylindrical electric conductors are joined by soldering or the like.

The semiconductor image sensor 1 including the above-described members has a structure in which the transparent resin is provided on the bare chip. This structure allows the semiconductor image sensor 1 to become thinner and smaller than the conventional semiconductor image sensor that is incorporated into a package. In addition, in the semiconductor image sensor 1 of this embodiment, the cylindrical electrodes 22 connected with the electrode terminals 20 are formed close to the surface on which light is incident. Therefore, the semiconductor image sensor 1 can be reduced in thickness as compared with the semiconductor image sensor described in Japanese Laid-Open Publication No. 2004-111792, in which wires are routed in the surface away from the light-incident surface. Furthermore, in the semiconductor image sensor 1, no wires are placed on the outer sides of the semiconductor substrate when viewed from above. This permits the semiconductor image sensor 1 to be reduced in size when viewed from above, as compared with the semiconductor image sensor disclosed in Japanese Laid-Open Publication No. 2004-111792.

Moreover, in the semiconductor image sensor 1 of this embodiment, gold wires do not necessarily have to be used to transmit the signals output from the pixels. It is therefore possible to suppress occurrence of flares and smears caused by light reflected from gold wires.

Furthermore, except for the upper faces of the cylindrical electrodes 22, the imaging area 14, the peripheral circuit area 16 and the electrode area 18 are protected by the transparent resin layer 24 having a relatively large thickness, which allows the semiconductor image sensor 1 of this embodiment to have a sufficiently long-term reliability, too.

Next, it will be described how to fabricate the semiconductor image sensor according to this embodiment. In this embodiment, a description will be made of an exemplary method for forming, in a semiconductor imaging element array 26, in which a plurality of semiconductor imaging elements 10 are arranged, the cylindrical electrodes 22 on the electrode terminals 20 provided in each semiconductor imaging element 10. FIGS. 3A to 3D are cross-sectional views illustrating the main process steps for fabricating the semiconductor image sensor of this embodiment.

Figure 3A:
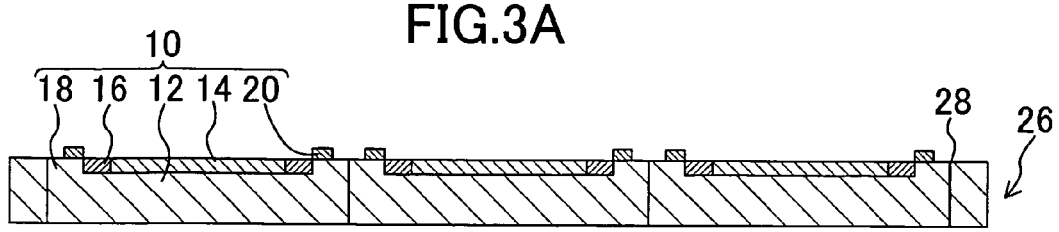
FIGS. 3A to 3D are cross-sectional views illustrating process steps for fabricating the semiconductor image sensor of the first embodiment.

First, as show in FIG. 3A, the semiconductor imaging element array 26, in which the semiconductor imaging elements 10 are provided, is formed on the principal surface of the semiconductor substrate 12 by using semiconductor process technology. Each semiconductor imaging element 10 includes the imaging area 14 having a CCD circuit or a CMOS circuit, the peripheral circuit area 16, and the electrode area 18 having the electrode terminals. The semiconductor imaging element array 26 is cut along dicing lines 28 in the final process step to obtain the individual semiconductor imaging elements 10.

Figure 3B:
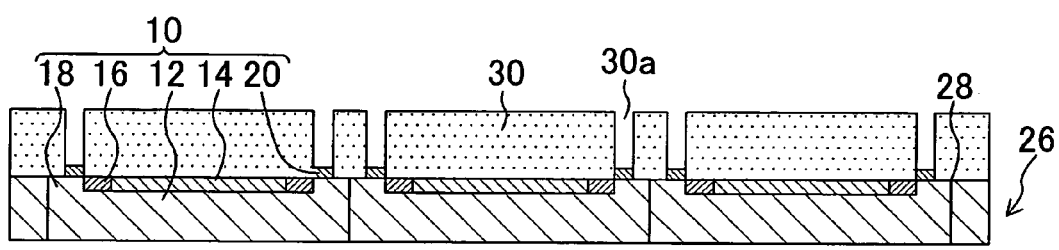

Subsequently, as shown in FIG. 3B, a photoresist 30 is applied to a circuit-formation surface of the semiconductor imaging element array 26. And an exposure process and a development process are carried out to form openings 30a in portions in the photoresist 30 that are located on the electrode terminals 20.

Figure 3C:
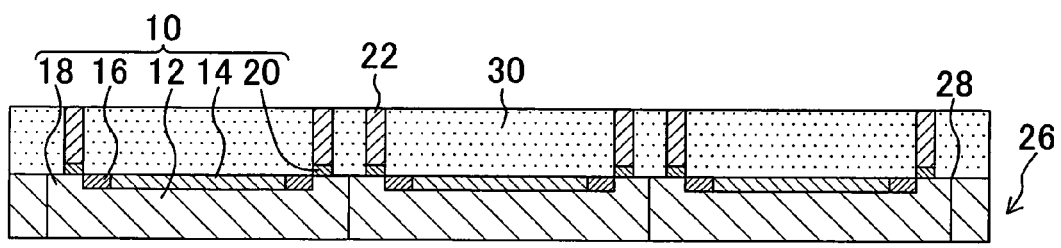

Then, as shown in FIG. 3C, the cylindrical electrodes 22 are formed in the openings 30a on the electrode terminals 20. It is easy and thus preferable to form the cylindrical electrodes 22 by depositing a metal material, such as copper (Cu), nickel (Ni), or gold (Au), by plating, for example. In the case where the cylindrical electrodes 22 are formed by plating, a metal film (not shown) may be formed in advance on the circuit-formation surface of the semiconductor imaging element array 26 by a vapor deposition process or by a sputtering process, for example. And if this metal film is used as electrodes, the cylindrical electrodes 22 having a uniform thickness can be easily formed across the entire circuit-formation surface. It is preferable to select, as the material of the metal film, a material that allows the metal film to be selectively etched and removed with the cylindrical electrodes 22 used as a mask after the formation of the cylindrical electrodes 22. Therefore, copper (Cu), nickel (Ni), gold (Au), solder or the like may be used as the material of the cylindrical electrodes 22.

Figure 3D:
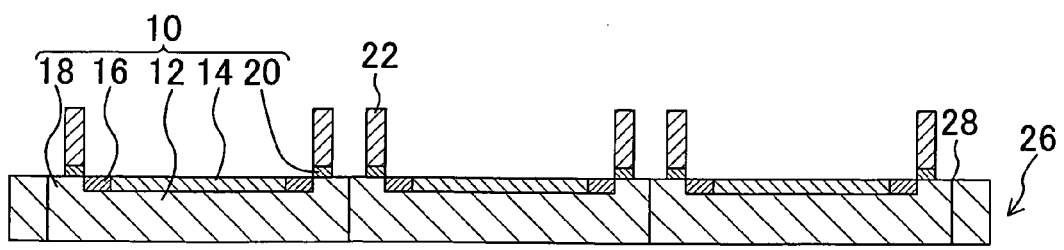

Next, as shown in FIG. 3D, the photoresist 30 is removed using a peeling solution or the like. For this process, a typical resist removing process may be adopted. By performing these process steps, the semiconductor imaging element array 26, in which the cylindrical electrodes 22 are formed on the respective electrode terminals 20 in the semiconductor imaging elements 10, is obtained. The height of each cylindrical electrode 22 is from 10 μm to 100 μm, for example, and the diameter thereof is equal to or smaller than 20 μm to 80 μm, for example.

The method for forming the cylindrical electrodes 22 is not limited to the above-described exemplary method, in which the openings 30a are formed in the photoresist 30 and the plating is performed to form the cylindrical electrodes 22, but various other methods may be employed.

For example, the cylindrical electrodes 22 may be formed in the following manner. After the formation of the openings 30a, a metal film having a thickness that allows the openings 30a to be filled with that metal film is formed by a vapor deposition process, by a sputtering process, or the like. Thereafter, the photoresist 30 is dissolved and removed using a peeling solution or the like.

Alternatively, the cylindrical electrodes 22 may be formed by a ball bonding process or a stud bump bonding process, in which thin metal wires such as gold (Au) wires and copper (Cu) wires are used. In this case, it is possible to simplify the fabrication process, because the ball bonding or the stud bump bonding can be performed in the state in which the electrode terminals 20 have been formed as shown in FIG. 3A.

Moreover, the cylindrical electrodes 22 may be formed, for example, by ultrasonic bonding of cylindrically processed gold (Au) electric conductors. In this case, it is also possible to simplify the fabrication process, because the cylindrical electrodes 22 can be formed in the state in which the electrode terminals 20 have been formed as shown in FIG. 3A.

Figure 4A:
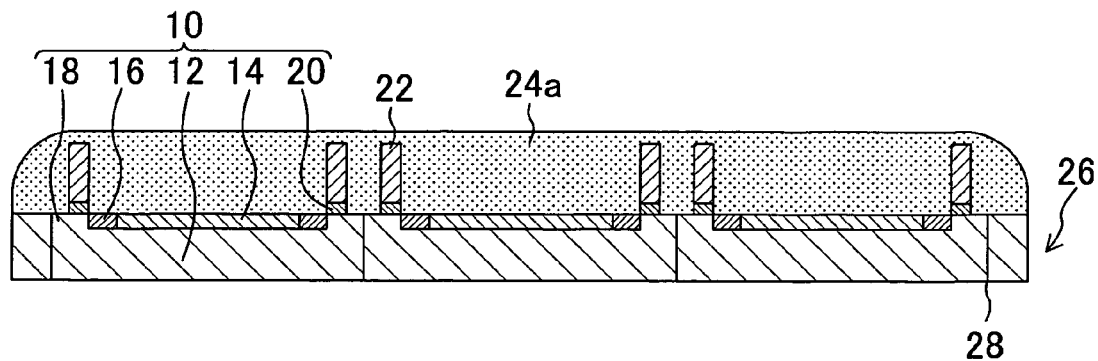
FIGS. 4A to 4C are cross-sectional views illustrating process steps for fabricating the semiconductor image sensor of the first embodiment.
Figure 4B:
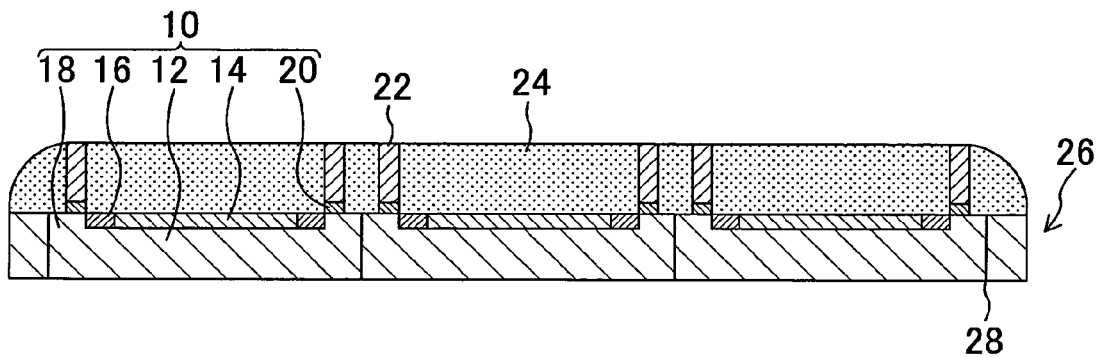
Figure 4C:
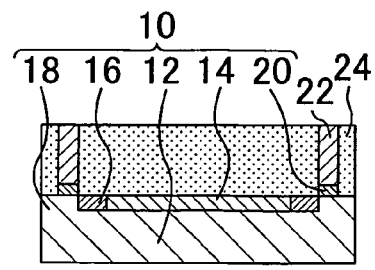

Next, in the semiconductor image sensor fabrication method according to this embodiment, the process steps following the process step shown in FIG. 3D will be described. FIGS. 4A to 4C are cross-sectional views illustrating the main process steps for fabricating the semiconductor image sensor of this embodiment.

As shown in FIG. 4A, after the process step shown in FIG. 3D, a transparent resin 24a is first applied onto the entire circuit-formation surface of the semiconductor imaging element array 26. In this process, the transparent resin 24a is formed to a thickness that allows at least the cylindrical electrodes 22 to be buried in the transparent resin 24a. After the application of the transparent resin 24a, the semiconductor imaging element array 26 is heated at a given temperature to cure the transparent resin 24a. When an ultraviolet curable resin is used as the transparent resin 24a, the transparent resin 24a may be cured by ultraviolet irradiation.

In the process step of applying the transparent resin 24a, the transparent resin 24a is formed to have a uniform thickness on the entire circuit-formation surface of the semiconductor imaging element array 26. Therefore, if the coating is applied by wire-bar coating, blade coating or the like using an epoxy resin prepared to have an appropriate viscosity, for example, it is possible to easily form the transparent resin 24a. It should be noted that not only the above-mentioned epoxy resin, but also an acrylic resin or a polyimide resin may be used.

Next, as shown in FIG. 4B, the transparent resin 24a is polished until the cylindrical electrodes 22 are exposed. In this polishing process, once the cylindrical electrodes 22 have been exposed to be polished, the friction coefficient and the like change as compared with the time when only the transparent resin 24a was polished. By detecting those changes in the polishing state, the thickness (height) of the cylindrical electrodes 22 and the thickness of the transparent resin 24a can be made equal to each other. Therefore, if the height of the cylindrical electrodes 22 is set as the set value for the transparent resin layer 24, the transparent resin layer 24 can be formed to have the thickness equal to that set value. By this process step, it is possible to obtain the transparent resin layer 24 whose thickness is uniform and equal to the set value. After the cylindrical electrodes 22 are exposed, the processed rough surface of the transparent resin layer 24 is polished into a mirror surface.

Subsequently, as shown in FIG. 4C, the semiconductor imaging element array 26 is diced along the dicing lines 28, thereby obtaining the semiconductor image sensors 1 of this embodiment.

In the above-described method of fabricating the semiconductor image sensors 1 according to this embodiment, the transparent resin layer 24 is formed by preparing the transparent resin 24a by a printing method such as wire-bar coating or blade coating. Nevertheless, the method for forming the transparent resin layer 24 is not limited to this. For instance, another method may be employed in which the semiconductor imaging element array 26 in the state shown in FIG. 3D is placed in a mold and the transparent resin 24a is poured into the mold to form the transparent resin layer 24.

As described above, according to the method for fabricating the semiconductor image sensors 1 of this embodiment, it is possible to realize a semiconductor image sensor that is thinner and smaller than conventional semiconductor image sensors. Furthermore, since the thickness of the transparent resin layer 24 can be made smaller than that of the conventional ones, the amount of incident light absorbed into the transparent resin layer 24 can be reduced. Therefore, the semiconductor image sensors 1, in which variation in optical characteristics is small, can be obtained at low cost.

Second Embodiment

Figure 5A:
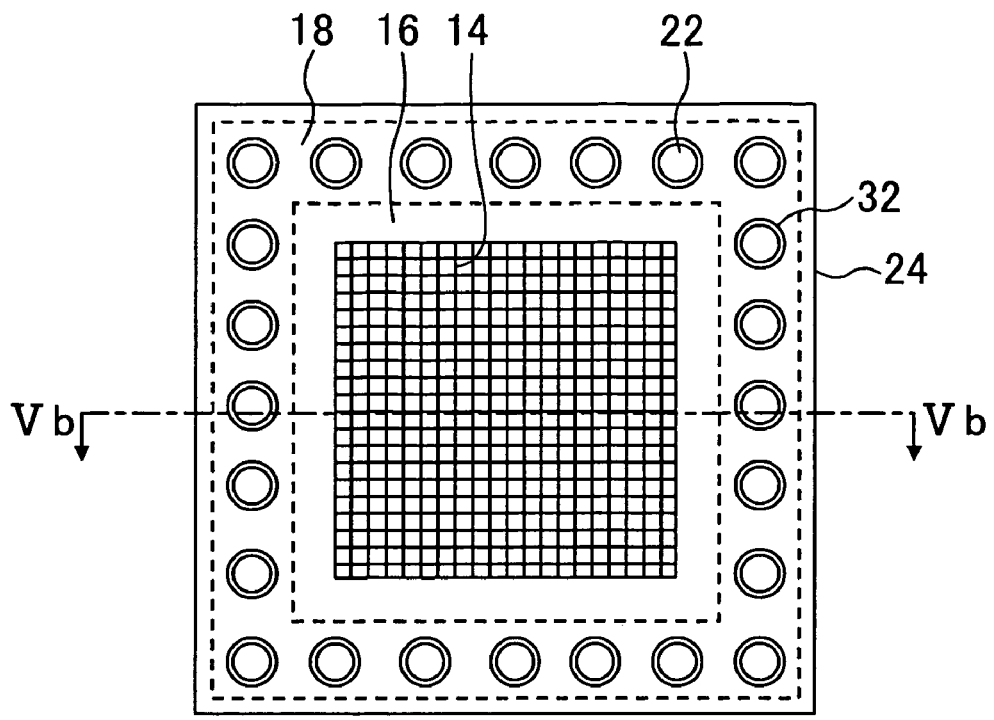
FIGS. 5A and 5B are a plan view and a cross-sectional view taken along the line Vb-Vb, respectively, each schematically illustrating the entire structure of a semiconductor image sensor according to a second embodiment of the present invention.
Figure 5B:
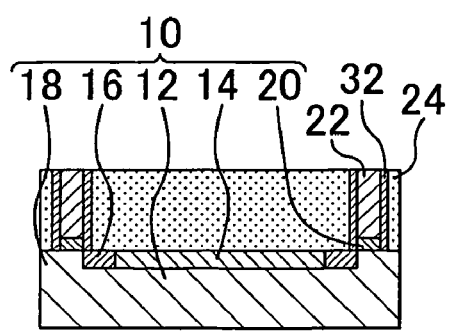

FIGS. 5A and 5B are a plan view and a cross-sectional view taken along the line Vb-Vb, respectively, each schematically illustrating the entire structure of a semiconductor image sensor according to a second embodiment of the present invention. In FIGS. 5A and 5B, the same members as those in the semiconductor image sensor of the first embodiment shown in FIG. 2 are identified by the same reference numerals.

The semiconductor image sensor 2 of this embodiment differs from the semiconductor image sensor 1 of the first embodiment in that an antireflection film 32 is formed around the side face (i.e., the perimeter) of each electrode terminal 20 and of each cylindrical electrode 22. In the other respects, the semiconductor image sensor 2 of this embodiment has the same structure as the semiconductor image sensor 1 of the first embodiment, and the descriptions of the same members will be thus omitted herein.

The antireflection films 32, which are made of a material such as a fluorine-containing polymer resin, for example, absorbs incident light. As will be described later, the material of the antireflection films 32 may be conductive, but does not have to be conductive. The antireflection films 32 may be made of any material, so long as the material absorbs light with wavelengths to which at least the imaging area 14 reacts. The antireflection films 32 have a thickness of from about 0.02 μm to about 3.0 μm.

Next, it will be described how to fabricate the semiconductor image sensor 2 according to this embodiment with reference to FIG. 6. FIGS. 6A to 6D are cross-sectional views illustrating the method for fabricating the semiconductor image sensor 2 of this embodiment.

Figure 6A:
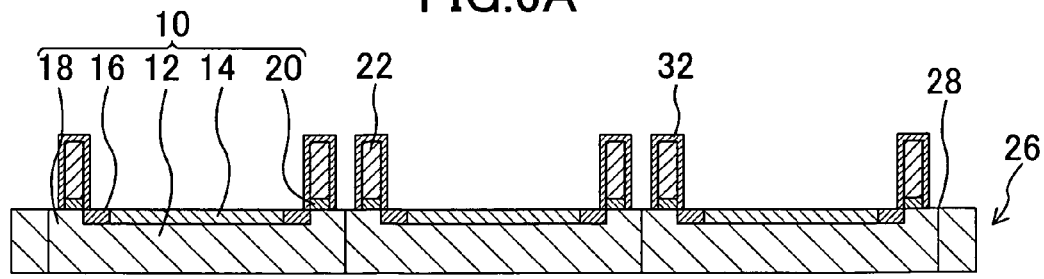
FIGS. 6A to 6D are cross-sectional views illustrating a method for fabricating the semiconductor image sensor according to the second embodiment.

First, as shown in FIG. 6A, the imaging areas 14 each having an array of pixels, the peripheral circuit areas 16, and the electrode areas 18 each having the electrode terminals 20 are formed on the semiconductor substrate 12 by using the same method as in the first embodiment, thereby forming the semiconductor imaging elements 10. And the same process steps as those illustrated in FIGS. 3B to 3D are performed to form the semiconductor imaging element array 26, in which the cylindrical electrodes 22 are formed on the electrode terminals 20. Thereafter, the antireflection films 32 are formed by subjecting the exposed portions of the respective cylindrical electrodes 22 and the side face portions of the respective electrode terminals 20 to a blackening process or the like. For example, where copper (Cu) is used as the material of the cylindrical electrodes 22, the surfaces can be blackened by plasma oxidation or wet oxidation. Alternatively, the antireflection films 32 may be formed by a method other than a blackening process. For instance, where gold (Au) is used as the cylindrical electrodes 22, the antireflection films 32 may be formed as follows. The imaging areas 14 and the peripheral circuit areas 16 are coated with a photoresist, and then a carbon (C) film, for example, is grown. Thereafter, the photoresist film is removed, whereby the antireflection film 32 is formed on the side face (the perimeter) of each cylindrical electrode 22.

Figure 6B:
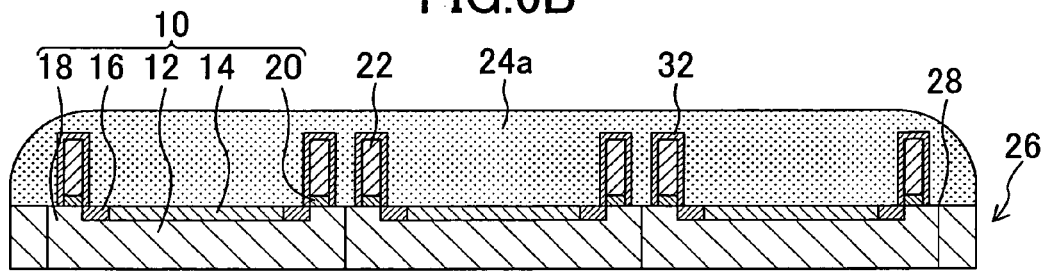

Next, as shown in FIG. 6B, a transparent resin 24a is applied onto the entire upper surface of the semiconductor imaging element array 26. In this process, the transparent resin 24a is formed to a thickness that allows at least the cylindrical electrodes 22 to be buried in the transparent resin 24a. Thereafter, the semiconductor imaging element array 26 is heated to a given temperature to cure the transparent resin 24a. In a case where the transparent resin 24a is an ultraviolet curable resin, the transparent resin 24a is cured by ultraviolet irradiation. In this process step, the transparent resin 24a is formed to have a uniform thickness on the entire surface of the semiconductor imaging element array 26. Therefore, if the coating is applied by wire-bar coating, blade coating or the like using an epoxy resin prepared to have an appropriate viscosity, for example, it is possible to easily form the transparent resin 24a. It should be noted that not only the above-mentioned epoxy resin, but also an acrylic resin or a polyimide resin may be used.

Figure 6C:
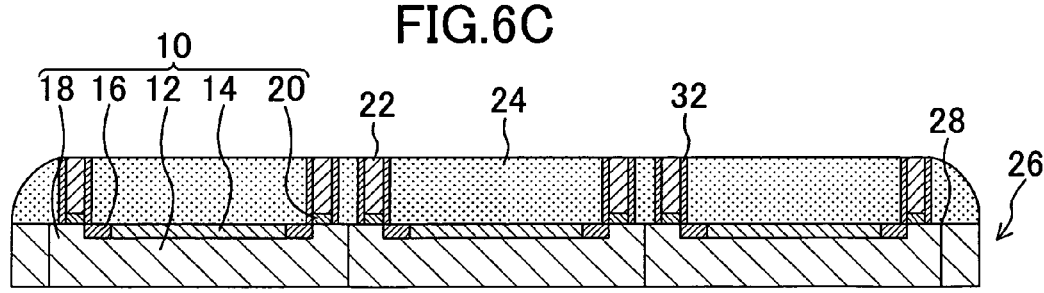

Next, as shown in FIG. 6C, in the semiconductor imaging element array 26 whose upper surface is entirely covered with the transparent resin 24a, the transparent resin 24a is polished until the upper surfaces of the respective cylindrical electrodes 22 are exposed. In this polishing process, once the cylindrical electrodes 22 have been exposed to be polished, the friction coefficient and the like change as compared with the time when only the transparent resin 24a was polished. By detecting those changes in the polishing state, therefore, the thickness of the cylindrical electrodes 22 and the thickness of the transparent resin 24a can be made equal to each other. Specifically, if the height of the cylindrical electrodes 22 is set as the set value for the transparent resin layer 24, the transparent resin layer 24 can be formed to have the thickness equal to that set value. By this process step, it is possible to obtain the transparent resin layer 24 whose thickness is uniform and equal to the set value. After the cylindrical electrodes 22 are exposed, the processed rough surface of the transparent resin layer 24 is polished into a mirror surface. By this polishing, the upper surface portion of each cylindrical electrode 22 is also polished, so that the part of each antireflection film 32 formed on the upper surface of each cylindrical electrode 22 is polished to be removed. Therefore, the antireflection films 32 do not have to be conductive.

Figure 6D:
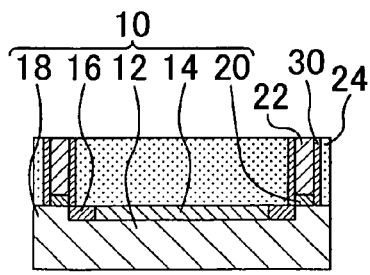

Subsequently, as shown in FIG. 6D, the semiconductor imaging element array 26 is diced along dicing lines 28, thereby obtaining the semiconductor image sensors 2 of this embodiment.

The semiconductor image sensors 2 fabricated according to the above-described method is thinner and smaller than conventional semiconductor image sensors. Furthermore, the antireflection films 32 are provided around the cylindrical electrodes 22 to prevent light incident from the outside from being reflected off the cylindrical electrodes 22. It is therefore possible to avoid occurrence of optical noise, such as flares and smears, caused by the striking of the light reflected from the cylindrical electrodes 22 on the imaging areas 14.

Third Embodiment

Figure 7A:
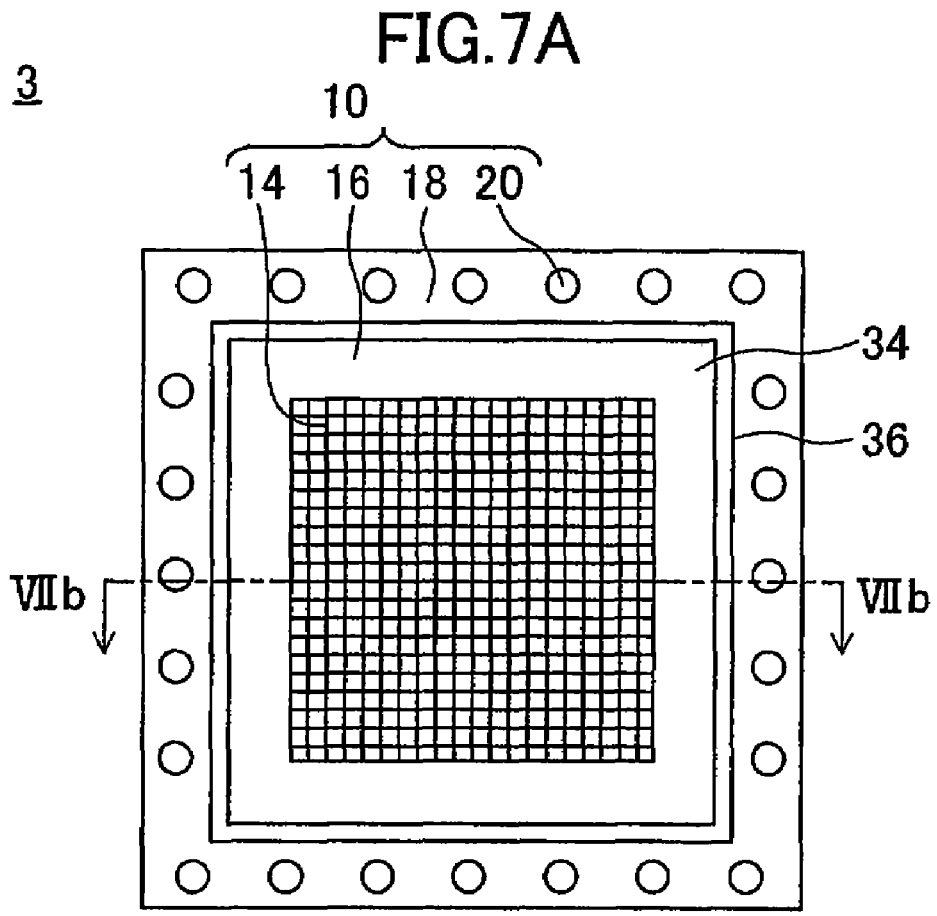
FIGS. 7A and 7B are a plan view and a cross-sectional view taken along the line VIIb-VIIb, respectively, each schematically illustrating the entire structure of a semiconductor image sensor according to a third embodiment of the present invention.
Figure 7B:
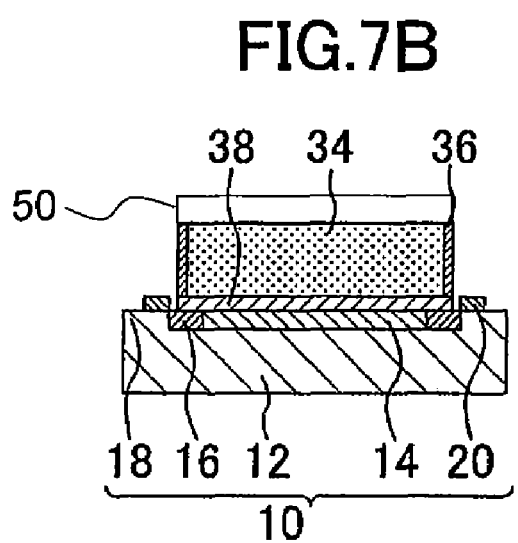

FIGS. 7A and 7B are a plan view and a cross-sectional view taken along the line VIIb-VIIb, respectively, each schematically illustrating the entire structure of a semiconductor image sensor according to a third embodiment of the present invention.

As shown in FIGS. 7A and 7B, the semiconductor image sensor 3 of this embodiment includes a semiconductor imaging element 10, a transparent resin adhesive 38 applied onto the upper surface (the circuit-formation surface) of an imaging area 14 in the semiconductor imaging element 10, a transparent sheet 34 bonded to the upper surface of the imaging area 14 with the transparent resin adhesive 38, and an antireflection film 36 provided on the perimeter (i.e., the side faces) of the transparent sheet 34.

As in the first embodiment, the semiconductor imaging element 10 includes a semiconductor substrate 12, and the imaging area 14, a peripheral circuit area 16, and an electrode area 18 including electrode terminals 20, each formed on the semiconductor substrate 12.

In the semiconductor image sensor of this embodiment, the antireflection film 36 is formed around the perimeter of the transparent sheet 34. Therefore, when light from the outside is incident on wire electrodes (not shown) connected to the electrode terminals 20, the antireflection film 36 prevents the light reflected from metal wires or the like used for the connection with an external device from entering the imaging area 14. Occurrence of flares and smears is thus prevented in the semiconductor image sensor 3 of this embodiment. In addition, the semiconductor image sensor 3 of this embodiment, like the semiconductor image sensors of the first and second embodiments, is thinner and smaller than conventional semiconductor image sensors. It should be noted that no cylindrical electrodes are provided in the semiconductor image sensor 3 of this embodiment.

In the other respects, the semiconductor image sensor 3 of this embodiment has the same structure as the semiconductor image sensor 1 of the first embodiment, and the descriptions of the same members will be thus omitted herein.

If the semiconductor image sensor 3 adopts a structure in which a glass substrate 50 is further provided as the uppermost layer over the imaging area 14 having the transparent resin adhesive 38 and the transparent sheet 34 formed thereon, the glass substrate avoids adhesion of dust coming from the outside, while preventing the transparent sheet 34 from being scratched. In this case, the transparent sheet 34 is preferably made of a material whose refractive index is lower than that of the glass substrate. Furthermore, if an antireflection film is provided on the side faces of the glass substrate, the antireflection film prevents unnecessary reflected light from entering the imaging area 14.

Next, it will be described how to fabricate the semiconductor image sensor 3 according to this embodiment. FIGS. 8A to 8D are cross-sectional views illustrating the method for fabricating the semiconductor image sensor 3 of this embodiment.

Figure 8A:
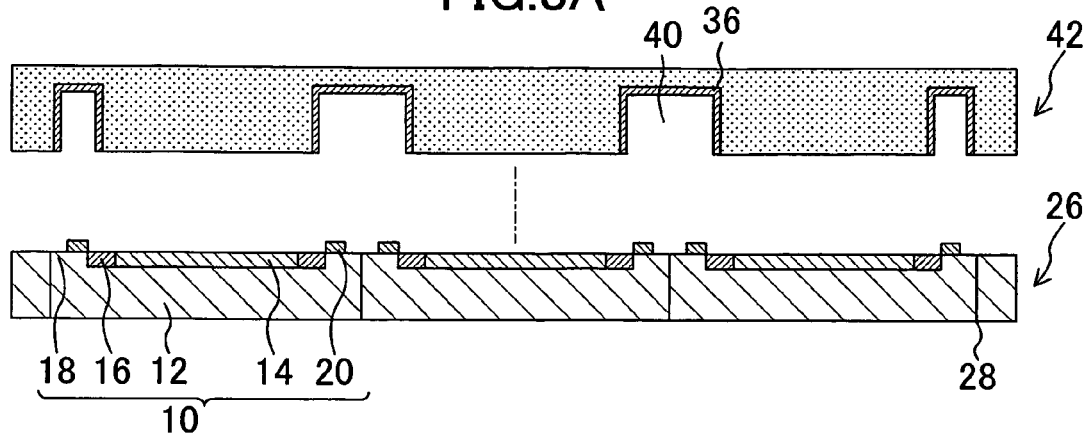
FIGS. 8A to 8D are cross-sectional views illustrating a method for fabricating the semiconductor image sensor of the third embodiment.

First, as shown in FIG. 8A, the semiconductor imaging elements 10 and a transparent sheet array 42 are prepared. In the lower surface of the transparent sheet array 42, U-shaped grooves 40 each having the antireflection film 36 on the inner walls thereof are formed. These grooves 40 are formed in regions corresponding to the electrode areas 18 in the semiconductor imaging element array 26 and each have a sufficient width to have corresponding part of the electrode areas 18 therein. The depth of the grooves 40 varies depending upon the design, but should be greater than the thickness of the transparent sheets 34 finally obtained after the completion of the process steps of forming the transparent sheets 34. The grooves 40 may be formed by etching the groove 40-forming-portions in the transparent sheet array 42 by a photolithography process and an etching process, for example. Alternatively, the grooves 40 may be formed by sand blasting or the like.

The antireflection films 36 are formed as follows. After the grooves 40 are formed, a photoresist film is first formed on the region other than the grooves 40, for example. Next, a black film made of carbon (C) or the like is grown over the transparent sheet array 42, and then the photoresist film is removed. By this process, the antireflection films 36 are formed only inside the grooves 40. It is preferable that the grooves 40 be formed by etching, sand blasting or the like, because the grooves 40 formed by such a method have small irregularities created in their inner faces, thereby producing more antireflection effects.

The method for forming the antireflection films 36 is not limited to the above-described methods, but a black resin may be directly formed by printing, by a drawing method, or the like.

Figure 8B:
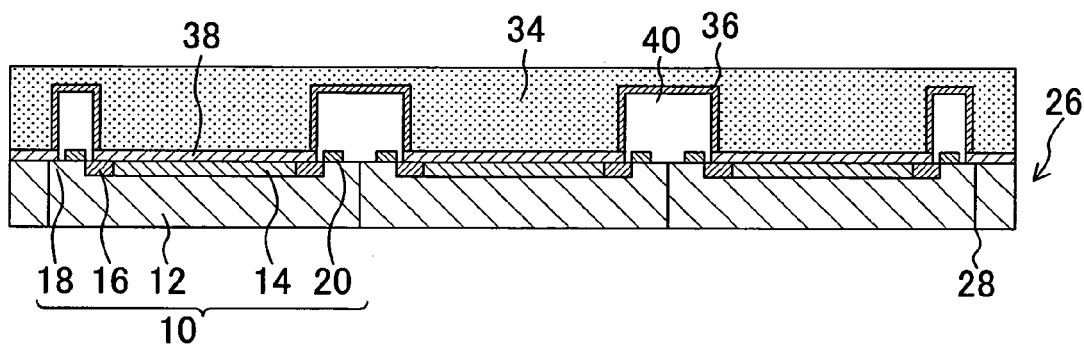

Subsequently, as shown in FIG. 8B, after the transparent resin adhesive 38 is applied onto the surface of the transparent sheet array 42 which is to be in contact with the imaging areas 14, the semiconductor imaging element array 26 and the transparent sheet array 42 are bonded to each other by abutment. The transparent resin adhesive 38 may have the same shape as the transparent sheet array 42, for example, and the transparent resin adhesive 38 in the form of sheet may be adhered to the transparent sheet array 42.

Figure 8C:
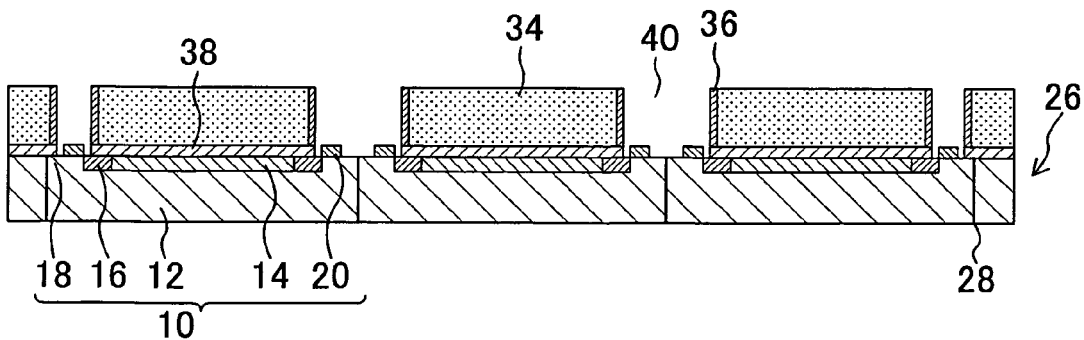

Then, as shown in FIG. 8C, the transparent sheet array 42 is polished from the surface in which no grooves 40 are formed. In this polishing process, after the polishing is performed until the grooves 40 are exposed, the processed rough surface of the transparent sheet array 42 is further polished into a mirror surface. The transparent sheet array 42 is separated by the polishing, whereby the transparent sheet 34 is formed on each imaging area 14.

Figure 8D:
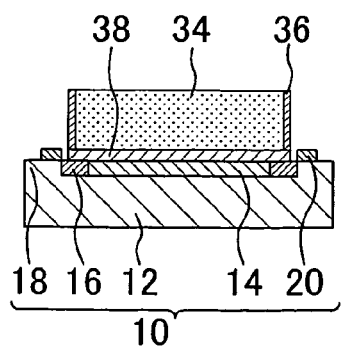

Next, as shown in FIG. 8D, the semiconductor imaging element array 26 is diced along dicing lines 28, thereby obtaining the semiconductor image sensors 3 of this embodiment.

In the semiconductor image sensors 3 of this embodiment, since the transparent sheets 34 are formed at the wafer level as described above, the fabrication process can be simplified considerably.

It should be noted that the transparent sheets 34 may be made of glass, quartz, transparent plastic, or the like that is transparent to wavelengths at which images are taken. Also, the transparent resin adhesive 38 for bonding the transparent sheets 34 may be either an ultraviolet curable adhesive or a heat curable adhesive.

According to the fabrication method of this embodiment, the semiconductor image sensors 3 that are thinner and smaller than conventional semiconductor image sensors can be fabricated, while the fabrication process is simplified considerably, which allows the semiconductor image sensors 3 to be obtained at low cost.

The semiconductor image sensors and the fabrication methods thereof according to the present invention are applicable to cell phones, digital cameras, video camera, and various other types of electronic devices in which an image sensor is used.

What is claimed is:

1. A semiconductor image sensor, which is connected with an external device when the sensor is used, the sensor comprising:

a semiconductor imaging element including a silicon substrate, an imaging area for detecting light disposed on the silicon substrate, a peripheral circuit area disposed on the silicon substrate, and an electrode area in which electrode terminals are formed on the silicon substrate;

a transparent resin layer formed on a circuit-formation surface of the semiconductor imaging element; and cylindrical electrodes formed on the electrode terminals, having an upper surface existing in the same plane as an upper surface of the transparent resin layer, and provided for connection with the external device, wherein:

an upper surface of the semiconductor imaging element is entirely covered with a transparent resin, and the silicon substrate is exposed at a side surface and a back surface of the semiconductor imaging element, an area of an upper surface of the transparent resin layer is substantially the same as that of the upper surface of the semiconductor imaging element, and side faces of the transparent resin layer and the semiconductor imaging element are substantially located in the same plane.

2. The sensor of claim 1, further comprising antireflection films provided on side faces of the cylindrical electrodes.

3. The sensor of claim 1, wherein the transparent resin layer is made of at least one material selected from the group consisting of epoxy resin, acrylic resin, and polyimide resin.

4. A semiconductor device, comprising:

a semiconductor substrate, an imaging area formed in a first surface of the semiconductor substrate for detecting light, said imaging area having an imaging element formed therein, a peripheral circuit area disposed around the imaging area and on the first surface, said peripheral circuit area having a peripheral circuit formed therein, an electrode terminal area disposed outside of the peripheral circuit area relative to the imaging area and on the first surface, said electrode terminal area having an electrode terminal formed therein; and a transparent component covering the imaging area, wherein at least one of outermost edges of the transparent component is disposed between said electrode terminal area and said imaging area, and all outermost edges of the transparent component are disposed between the imaging area and edges of the semiconductor substrate.

5. The sensor of claim 4, further comprising a first antireflection film provided on side faces of the transparent component.

6. The sensor of claim 4, further comprising a glass substrate provided on or above the transparent component.

7. The sensor of claim 6, comprising a second antireflection film provided at least on side faces of the transparent component and on side faces of the glass substrate.

8. The sensor of claim 6, wherein the adhesive member and the transparent component are both made of material whose refractive index is lower than that of the glass substrate.

9. The sensor of claim 4, wherein said electrode terminal area includes electrode terminals formed in all sides of said electrode terminal area.

10. The sensor of claim 4, wherein said electrode terminal has a height which is less than the height of said transparent component relative to the first surface of said semiconductor substrate.

11. The sensor of claim 4, wherein said transparent component has a rectangular shape.

12. The sensor of claim 11, wherein none of the outermost edges of the transparent component extend into the electrode terminal area in plane view.

13. The sensor of claim 11, wherein none of the outermost edges of the transparent component extend to the edges of the semiconductor substrate in plane view.

14. The sensor of claim 11, wherein all of the outermost edges of the transparent component extend into the peripheral circuit area in plane view.

15. The sensor of claim 4, further comprising a wire connected to the electrode terminal.

* * * * *